(12) United States Patent
Sung et al.

(10) Patent No.: US 8,952,396 B2
(45) Date of Patent: Feb. 10, 2015

(54) LED MODULE, BACKLIGHT UNIT INCLUDING THE LED MODULE, AND METHOD FOR MANUFACTURING THE LED MODULE

(75) Inventors: Jee Hoon Sung, Seongnam-si (KR); Jin Hyun Cho, Seoul (KR); Jung Kyun Kim, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 174 days.

(21) Appl. No.: 13/475,323

(22) Filed: May 18, 2012

(65) Prior Publication Data
US 2012/0294042 A1 Nov. 22, 2012

(30) Foreign Application Priority Data
May 18, 2011 (KR) .................. 10-2011-0046759

(51) Int. Cl.
| | | |
|---|---|---|
| G09F 13/18 | (2006.01) | |
| H01L 33/48 | (2010.01) | |
| H01L 33/64 | (2010.01) | |
| H05K 1/02 | (2006.01) | |
| H01L 33/62 | (2010.01) | |
| H05K 1/05 | (2006.01) | |

(52) U.S. Cl.
CPC ............ *H01L 33/641* (2013.01); *H05K 1/0204* (2013.01); *H01L 33/62* (2013.01); *H01L 33/642* (2013.01); *H05K 1/056* (2013.01); *H05K 2201/10106* (2013.01); *H01L 2224/48247* (2013.01); *H01L 2224/73265* (2013.01)
USPC .............................................. 257/88; 257/98

(58) Field of Classification Search
CPC ....... H01L 33/62; H01L 33/641; H01L 33/642
USPC ....................................... 257/98, 99
See application file for complete search history.

(56) References Cited

U.S. PATENT DOCUMENTS

| | | | | |
|---|---|---|---|---|
| 6,060,777 | A * | 5/2000 | Jamieson et al. ............ | 257/707 |
| 7,868,349 | B2 * | 1/2011 | Kim et al. ...................... | 257/100 |
| 2006/0030063 | A1* | 2/2006 | Wang et al. ..................... | 438/22 |
| 2008/0048204 | A1* | 2/2008 | Ishikura et al. ................. | 257/99 |
| 2008/0290363 | A1* | 11/2008 | Lin et al. ......................... | 257/99 |
| 2009/0026485 | A1* | 1/2009 | Urano et al. .................... | 257/99 |

FOREIGN PATENT DOCUMENTS

JP 2007-080863 A 3/2007

\* cited by examiner

*Primary Examiner* — Stephen F Husar
*Assistant Examiner* — James Cranson, Jr.
(74) *Attorney, Agent, or Firm* — Sughrue Mion, PLLC

(57) ABSTRACT

A light emitting diode (LED) module having a structure capable of effectively dissipating heat generated from an LED chip thereof, and a backlight unit including the same are disclosed. The LED module includes a base made of a metal material, an insulating layer provided on the base, a circuit layer provided on the insulating layer, an LED package provided on the circuit layer, and a bonding layer extending through the insulating layer and the circuit layer, to connect the LED package to the base.

10 Claims, 11 Drawing Sheets

LED MODULE, BACKLIGHT UNIT INCLUDING THE LED MODULE, AND METHOD FOR MANUFACTURING THE LED MODULE

CROSS-REFERENCE TO RELATED APPLICATION

This application claims priority from Korean Patent Application No. 10-2011-0046759 filed on May 18, 2011 in the Korean Intellectual Property Office, the disclosure of which is incorporated herein by reference in its entirety.

BACKGROUND

1. Field

Apparatuses and methods consistent with exemplary embodiments relate to a light emitting diode (LED) module usable in backlight units, a backlight unit including the LED module, and a method of manufacturing the LED module.

2. Description of the Related Art

Liquid crystal display (LCD) panels, which are mounted to display devices or the like, do not have a self-luminous function. For this reason, a backlight unit (BLU) is disposed at the rear of such an LCD panel, to generate light and to provide the generated light to the LCD panel.

Recently, a backlight unit, which includes an LED module which is advantageous in terms of manufacturing costs and size, has been increasingly used.

The LED module is manufactured using a method in which LED chips are mounted on a printed circuit board (PCB). Generally, each LED chip is manufactured in the form of an LED package. LED packages are mounted on a PCB, which includes a wiring layer, an insulating layer, etc., using a surface mounting technology (SMT) process (technology to mount LED packages on a surface (circuit layer) of a PCB).

In a structure in which LED packages are mounted on a PCB using the SMT process, as mentioned above, however, there is a problem in that heat dissipation efficiency is degraded because heat generated from the LED chips passes through various heat resisting elements in the process of being transferred to a back of the PCB. To this end, an LED package mounting structure capable of achieving an enhancement in heat dissipation efficiency is required.

SUMMARY

One or more exemplary embodiments may provide a light emitting diode (LED) module capable of efficiently dissipating heat generated from LED chips thereof, and a backlight unit including the same.

Additional aspects of exemplary embodiments will be set forth in part in the description which follows and, in part, will be obvious from the description, or may be learned by practice.

In accordance with an aspect of an exemplary embodiment, a light emitting diode (LED) module includes a base made of a metal material, an insulating layer provided on the base, a circuit layer provided on the insulating layer, an LED package provided on the circuit layer, and a bonding layer extending through the insulating layer and the circuit layer, to connect the LED package to the base.

The bonding layer may include a paste made of a metal material.

The LED package may include an LED chip, and a heat dissipation member coupled to a lower surface of the LED chip and bonded to the bonding layer.

The heat dissipation member may be made of a metal material, and may include a heat slug to achieve an enhancement in heat transfer efficiency.

The LED package may include an electrode to supply power to the LED chip, and a wire to connect the electrode to the LED chip.

The heat dissipation member may be electrically isolated from the electrode.

The LED chip may be coupled to a back of the heat dissipation member by a conductive adhesive.

A heat sink may be coupled to a lower surface of the base, to guide heat transferred from the LED package to the base.

In accordance with an aspect of another exemplary embodiment, a light emitting diode (LED) module includes a base made of a metal material, a circuit layer provided on the base, an insulating layer provided between the base and the circuit layer, an LED package provided on the circuit layer, and a bonding layer provided within a through hole, wherein the through hole extends through the insulating layer and the circuit layer, and the bonding layer fixes the LED package to the base.

The LED package may comprise an LED chip which is disposed in a position corresponding to a position of the through hole.

In accordance with an aspect of another exemplary embodiment, a backlight unit includes a light guide member, and an LED module to irradiate light toward a side surface of the light guide member, wherein the LED module includes a base made of a metal material, an insulating layer provided on the base, a circuit layer provided on the insulating layer, at least one LED package provided on the circuit layer, and a bonding layer extending through the insulating layer and the circuit layer, to connect the LED package to the base.

The at least one LED package of the LED module may include a plurality of LED packages. The plurality of LED packages may be arranged in an array along the side surface of the light guide member.

The bonding layer may include a paste made of a metal material.

The LED package may include an LED chip, and a heat dissipation member coupled to a lower surface of the LED chip, to transfer heat generated from the LED chip to the bonding layer.

The heat dissipation member may be made of a metal material, and may include a heat slug to achieve an enhancement in heat transfer efficiency.

The LED package may include an electrode to supply power to the LED chip, and a wire to connect the electrode to the LED chip.

The heat dissipation member may be electrically isolated from the electrode.

The LED chip may be coupled to a back of the heat dissipation member by a conductive adhesive.

A heat sink may be coupled to a lower surface of the base, to guide heat transferred from the LED package to the base.

In accordance with an aspect of another exemplary embodiment, a method for manufacturing an LED module includes laminating an insulating layer and a metal layer over a base made of a metal material, forming a through hole through the insulating layer and the metal layer such that the base is exposed through the through hole, patterning the metal layer, to form a circuit layer, injecting, into the through hole, a solder paste made of a metal material, disposing an LED package on the solder paste, and fixing the LED package to the base via the solder paste.

The solder paste may be injected into the through hole in the form of powder. The solder paste may be fixed to the LED package through processes of applying heat to the powder type solder paste, to melt the powder type solder paste, and then solidifying the melted solder paste.

The metal layer may include a thin plate made of a copper material.

In accordance with an aspect of another exemplary embodiment, a method for manufacturing an LED module includes laminating an insulating layer and a metal layer on a base made of a metal material, patterning the metal layer, to form a circuit layer, forming a through hole through the insulating layer and the metal layer such that the base is exposed through the through hole, injecting, into the through hole, a solder paste made of a metal material, and fixing the LED package to the base via the solder paste.

In accordance with an aspect of another exemplary embodiment, a method for manufacturing an LED module includes forming a through hole through an insulating layer and a metal layer, laminating the through hole-formed insulating layer and metal layer over a base made of a metal material, patterning the metal layer, to form a circuit layer, injecting, into the through hole, a solder paste made of a metal material, and disposing an LED package on the solder paste, and fixing the LED package to the base via the solder paste.

BRIEF DESCRIPTION OF THE DRAWINGS

These and/or other exemplary aspects will become apparent and more readily appreciated from the following description of exemplary embodiments, taken in conjunction with the accompanying drawings of which.

DETAILED DESCRIPTION

Hereinafter, exemplary embodiments will be described with reference to the accompanying drawings.

Figure 1:
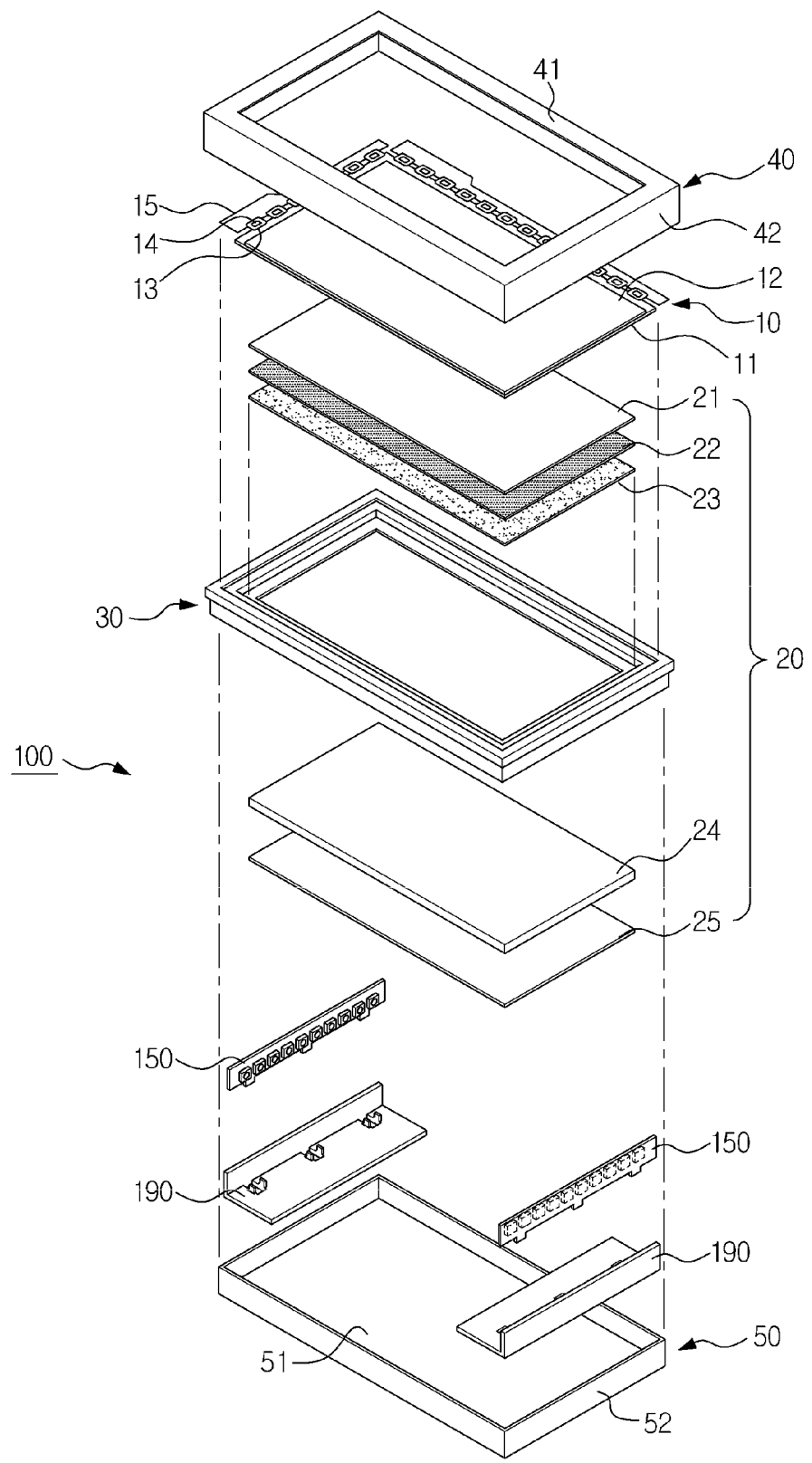
FIG. 1 is an exploded perspective view of a display module including a backlight unit according to an exemplary embodiment.
Figure 2:
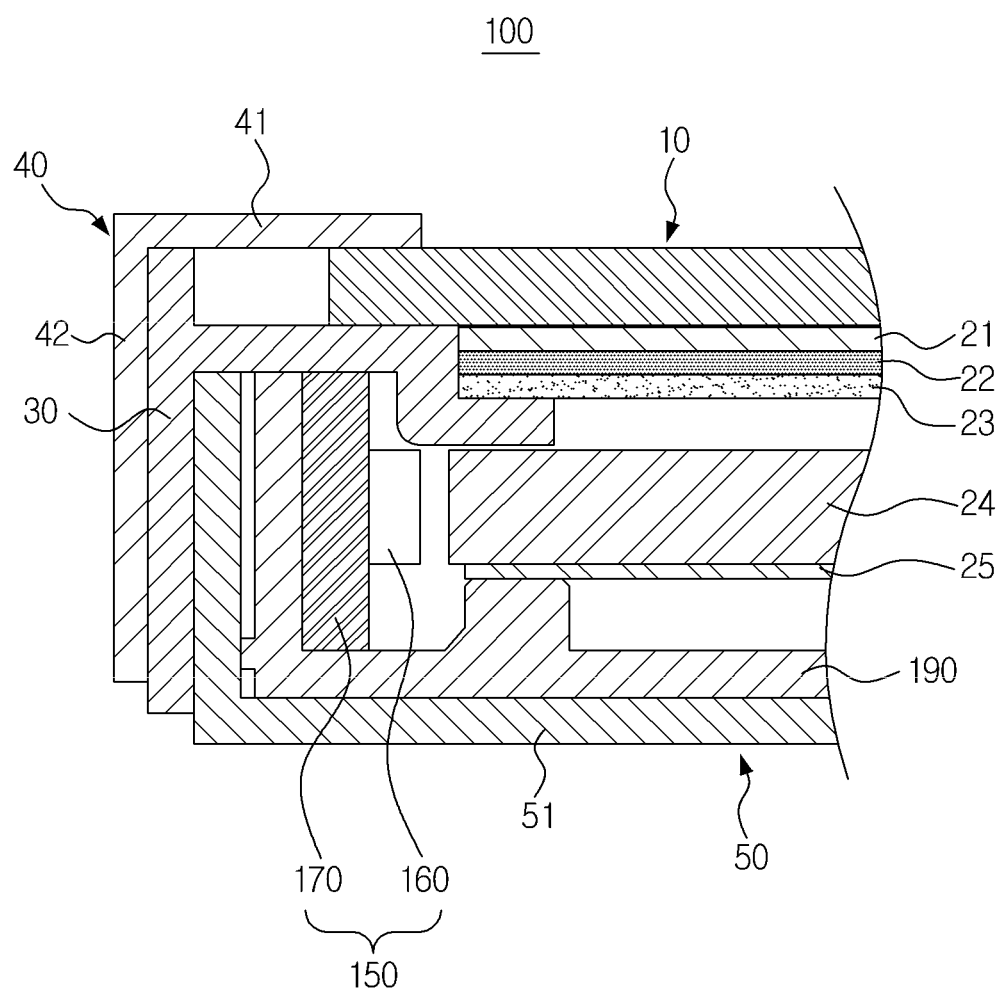
FIG. 2 is a sectional view illustrating one side of the display module, which includes the backlight unit according to an exemplary embodiment.

FIG. 1 is an exploded perspective view of a display module including a backlight unit according to an exemplary embodiment. FIG. 2 is a sectional view illustrating one side of the display module, which includes the backlight unit according to an exemplary embodiment.

As shown in FIGS. 1 and 2, the display module, which is designated by reference numeral "100", includes a liquid crystal display (LCD) panel 10, a backlight unit 20 disposed behind the LCD panel 10 while being spaced apart from the LCD panel 10, and a middle mold 30 to support the LCD panel 10 and backlight unit 20 such that the LCD panel 10 and backlight unit 20 are spaced apart from each other. The display module 100 also includes a front chassis 40 disposed in front of the LCD panel 10, and a back chassis 50 disposed behind the backlight unit 20.

The LCD panel 10 includes a thin film transistor (TFT) substrate 11 formed with TFTs, a color filter substrate 12 facing the TFT substrate 11 and a liquid crystal layer (not shown) interposed between the TFT substrate 11 and the color filter substrate 12.

The LCD panel 10 also includes a flexible circuit board 13 mounted, at one side thereof, to a side of the TFT substrate 11, driving chips 14 mounted on the flexible circuit board 13, and a panel circuit board 15 connected to the other side of the flexible circuit board 13.

Although the LCD panel 10 may form an image through adjustment of the alignment of the liquid crystal layer, it cannot emit light by itself. To this end, the backlight unit 20 is disposed at the back side of the LCD panel 10, to supply light to the LCD panel 10.

The backlight unit 20 includes a plurality of optical sheets disposed beneath the LCD panel 10, a light guide member 24 disposed beneath the plural optical sheets, a reflection sheet 25 disposed on a lower surface of the light guide member 24, and light emitting diode (LED) modules 150 to supply light to the light guide member 24.

The optical sheets may include a protection film 21, a prism film 22, and a diffusion film 23.

The protection film 21 is disposed on the prism film 22, to protect the prism film 22, which is sensitive to scratches caused by dust.

The prism film 22 has an array of triangular micro-prisms formed on a front surface of the prism film 22, to condense light diffused by the diffusion film 23 in a direction perpendicular to the plane of the LCD panel 10, which is disposed in front of the prism film 22. Typically, two prism films 22 are used. In this case, the micro-prisms formed on each prism film 22 form a certain angle with respect to the prism film 22. Light emerging from the prism film 22 advances in a direction perpendicular to a plane of the prism film 22, thereby achieving uniform brightness distribution.

The diffusion film 23 includes a base plate and a coating layer with beads formed on the base plate to diffuse light emerging form the light guide member 24 and to supply the diffused light to the LCD panel 10.

The light guide member 24 is made of an acryl-based resin such as polymethyl methacrylate (PMMA) or polymethylstyrene. The light guide member 24 uniformly supplies light emitted from the LED modules 150. The side surface of the light guide member 24 facing each LED module 150 functions as an incident face upon which light emitted from the LED module 150 is incident. The front surface (upper surface in FIG. 1) of the light guide member 24 facing the diffusion film 23 functions as an emission face from which light is emitted. The back surface (lower surface in FIG. 1) of the light guide member 24, which is opposite to the emission face while facing the reflection sheet 25, functions as a reflection face to reflect light.

The reflection sheet 25 is disposed beneath the light guide member 24, to again guide light reflected from the lower surface of the light guide member 24 toward the light guide member 24. The reflection sheet 25 may be made of a plastic material such as polyethylene terephthalate (PET) or polycarbonate (PC).

The front chassis 40 includes a bezel 41 to enclose a peripheral portion of the LCD panel 10, and a front rim 42 bent from an outer peripheral edge of the bezel 41. The bezel 41 extends between an outline of the LCD panel 10 and an outline of an active area of the LCD panel 10 where an image is actually displayed.

The back chassis 50 includes a back portion 51, on which the backlight unit 20 is seated, and a back rim 52 extending forward from a peripheral edge of the back portion 51. The back chassis 50 is made of a thermally conductive metal, to dissipate heat transferred from LED packages 160.

The LED modules 150 are disposed at two symmetrical side surfaces among four side surfaces of the light guide member 24, to face the symmetrical side faces, respectively. Each LED module 150 includes a plurality of LED packages 160 to emit light, and a printed circuit board (PCB) 170 formed with a conductive pattern to enable an electrical signal to flow through the plurality of LED packages 160.

Each LED package 160 of each LED module 150 faces, at an emission face thereof, a corresponding one of the incident faces of the light guide member 24 while being connected to the corresponding PCB 170 at a surface of the LED package 160 opposite to the emission face. The LED packages 160 of each LED module 150 form an array extending longitudinally on the corresponding PCB 170 while being spaced apart from one another.

The PCB 170 corresponding to each LED module 150 is elongated to have a length corresponding to that of the corresponding side surface of the light guide member 24. The back surface of the PCB 170 is coupled to the back chassis 50 via a heat sink 190. Accordingly, heat generated from the LED packages 160 is transferred to the back chassis 50 via the heat sink 190, and is then outwardly dissipated.

Hereinafter, the structure of each LED module 150, which includes the LED packages 160 and PCB 170, will be described in more detail.

Figure 3:
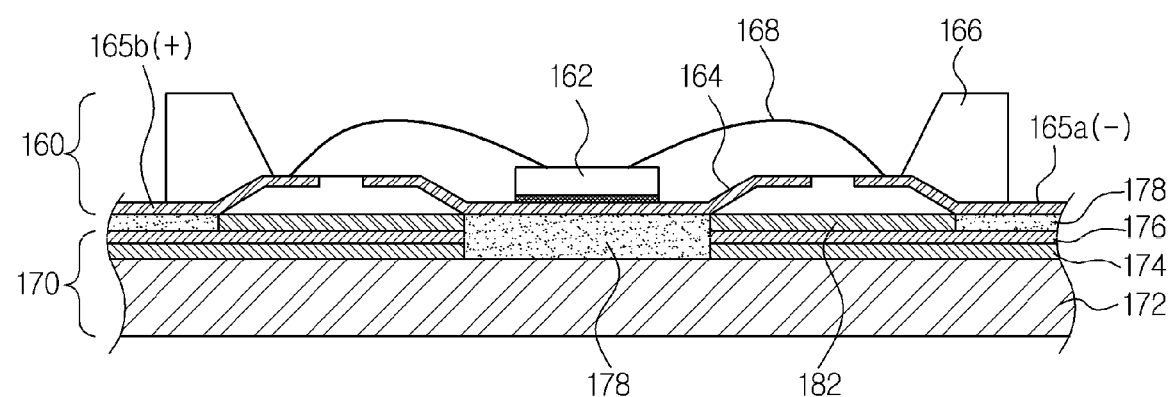
FIG. 3 is a sectional view illustrating a portion of one light emitting diode (LED) module according to an exemplary embodiment

FIG. 3 is a sectional view illustrating a portion of one LED module according to an exemplary embodiment.

As shown in FIG. 3, the LED module 150 has a structure including a base 172 made of a metal material, a circuit layer 176 formed over the base 172, an insulating layer 174 interposed between the base 172 and the circuit layer 176, and LED packages 160 mounted on the circuit layer 176. In FIG. 3, only one LED package 160 is shown. The structure of the LED module 150 also includes a bonding layer 178 formed to extend through the insulating layer 174 and circuit layer 176, to directly connect the LED packages 160 to the base 172 in a fixed state.

The base 172 supports the insulating layer 174, circuit layer 176 and LED packages 160, which are arranged over the base 172. The base 172 also functions as a heat dissipation layer to dissipate heat generated from the LED packages 160. The base 172 may be made of a metal material exhibiting excellent electrical and heat transfer characteristics. For example, the base 172 may be formed using copper (Cu), aluminum (Al), stainless steel, or plated stainless steel plates.

The circuit layer 176 is formed with a circuit pattern, on one surface thereof, to enable an electrical signal to flow to the LED packages 160. The circuit layer 176 may be made of a metal material exhibiting excellent electrical characteristics, such as copper (Cu).

The insulating layer 174 is interposed between the base 172 and the circuit layer 176, to electrically insulate the base 172 and circuit layer 176 from each other. The insulating layer 174 may be made of resin, ceramic, polyimide (PI), epoxy, or the like. In particular, the insulating layer 174 may be made of an epoxy material exhibiting excellent electrical and mechanical characteristics.

The above-described base 172, insulating layer 174, and circuit layer 176 form the PCB 170, on which the LED packages 160 are mounted.

Each LED package 160 mounted on the PCB 170 includes an LED chip 162 to generate light, a first heat dissipation member 164 coupled to a lower surface of the LED chip 162, second heat dissipation members 165a and 165b disposed around the first heat dissipation member 164, and a mold 166 to form a space, into which phosphors are injected.

The LED chip 162 is fixed to a surface of the first dissipation member 164 by an adhesive such as an epoxy material including silicon (Si) or the like.

The first heat dissipation member 164, and second heat dissipation members 165a and 165b transfer heat away from the LED package 160. In particular, the first heat dissipation member 164 contacts the LED chip 162, thereby directly transferring the heat generated from the LED package 160 to the PCB 170. Accordingly, the first heat dissipation member 164, and second heat dissipation members 165a and 165b may be made of a metal material exhibiting high heat transfer efficiency, such as copper (Cu) or aluminum (Al).

In order to enhance the heat dissipation efficiencies of the first heat dissipation member 164, and second heat dissipation members 165a and 165b, the LED package 160 may further include a heat slug made of a metal material.

The second heat dissipation members 165a and 165b are formed with electrodes having different polarities, to supply power to the LED chip 162. The electrodes are electrically connected to the LED chip 162 via wires 168, to supply power.

Figure 4A:
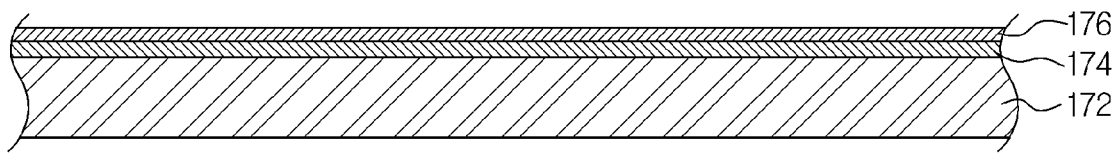
FIGS. 4A to 4D are views illustrating an LED module manufacturing method according to an exemplary embodiment.
Figure 4B:
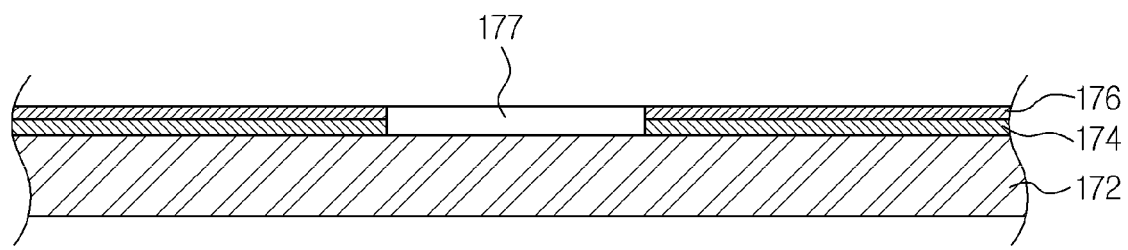
Figure 4C:
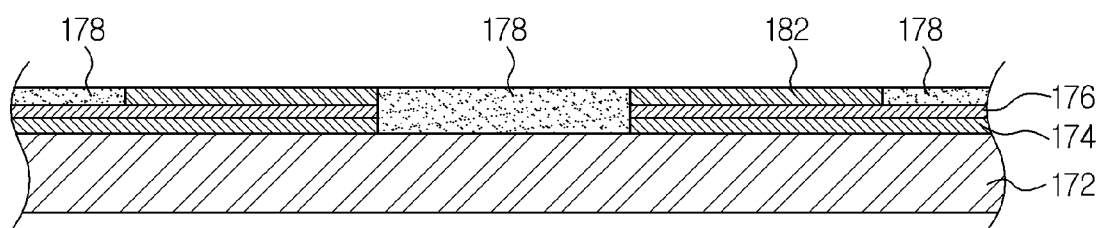
Figure 4D:
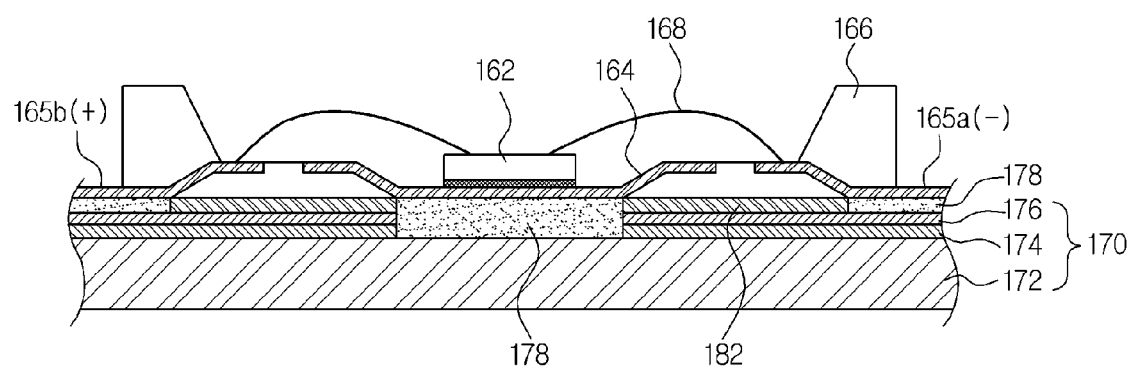
Figure 5A:
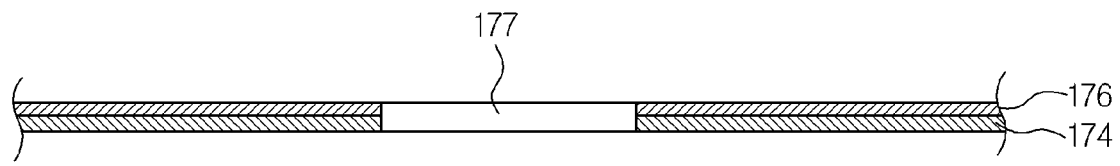
FIGS. 5A to 5D are views illustrating an LED module manufacturing method according to another embodiment.
Figure 5B:
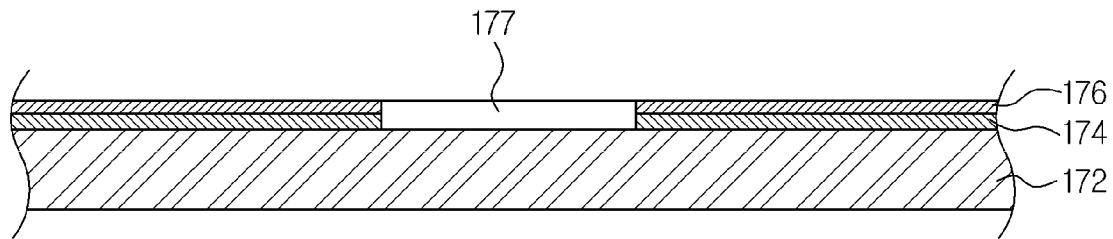
Figure 5C:
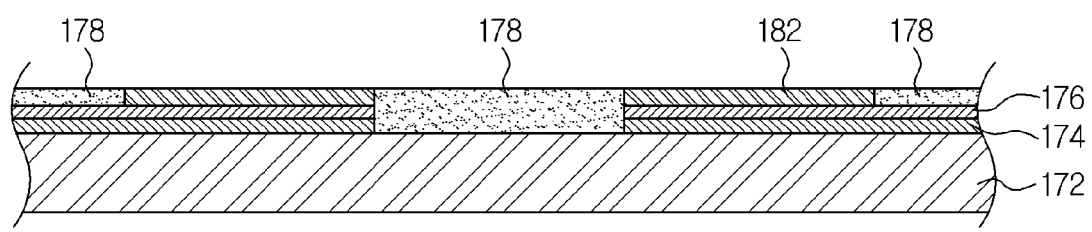
Figure 5D:
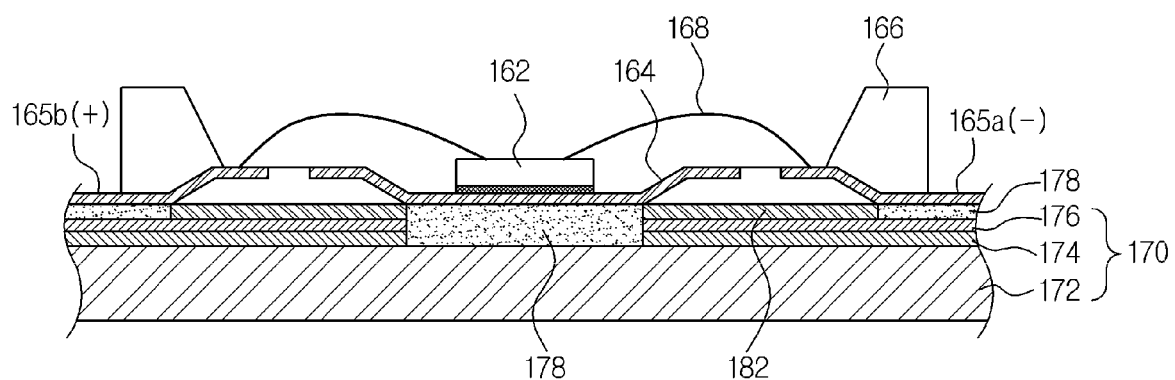

The LED package 160 is fixedly coupled to the PCB 170 by the bonding layer 178. The bonding layer 178 is injected into a through hole 177 (FIG. 4B), to connect the LED package 160 and base 172. The through hole 177 extends through the insulating layer 174 and circuit layer 176 such that the base 172 is exposed.

For the bonding layer 178, a conductive solder paste made of a metal material exhibiting high heat transfer efficiency may be used.

Thus, heat generated from the LED chip 162 is effectively outwardly dissipated from the LED module 150. This is because heat generated from the LED chip 162 is transferred along a heat dissipation path established through the first heat dissipation member 164, bonding layer 178, and base 172, which are made of metal materials exhibiting high heat transfer efficiency, without passing through the insulating layer, etc., which function as heat transfer resistance elements. Since heat generated from the LED chip 162 is effectively dissipated, the life span of the LED chip 162 may be increased. Also, the insulating layer or circuit layer may be formed to have various thicknesses, using various materials, because it may be possible to achieve an enhancement in heat dissipation efficiency thereby, without taking into consideration the heat transfer resistance of the insulating layer, in that the LED chip 162 is directly connected to the base 172, which has a heat dissipation function, via the bonding layer 178.

Meanwhile, the first heat dissipation member 164, and second heat dissipation members 165a and 165b have separate structures, respectively. Since the first dissipation member 164, bonding layer 178, and base 172 are made of metal materials, current flows through the LED chip 162, and the first dissipation member 164, bonding layer 178, and base 172 sequentially disposed beneath the LED chip 162. If current flowing through the base 172 flows to the electrodes of another LED package 160 disposed adjacent to the base 172, a short circuit may occur. In order to avoid such a short circuit, the above-described separate structures are provided.

Hereinafter, a method for manufacturing an LED module 150 will be described.

FIGS. 4A to 4D are views illustrating an LED module manufacturing method according to an exemplary embodiment. FIGS. 5A to 5D are views illustrating an LED module manufacturing method according to another exemplary embodiment.

As shown in FIGS. 4A to 4D, the insulating layer 174 and a metal layer are laminated over the base 172, which is made of a metal material. Thereafter, the through holes 177 are formed through the insulating layer 174 and metal layer, to expose the base 170. For simplicity of description, the following description will be given only in conjunction with one through hole 177, however, there may be a plurality of through-holes. The metal layer is a thin plate made of a copper material to form the circuit layer 176. The through hole 177 may be formed using a mechanical drilling process, a cutting process using a laser, or the like.

Subsequently, the metal layer is patterned to form the circuit layer 176. A masking layer 182 is then laminated on an upper surface of the circuit layer 176, except for a region, into which a solder paste is to be injected.

After completion of the lamination of the masking layer 182, a solder paste having the form of powder is injected into a region not covered by the masking layer 182, namely, the through hole 177 formed through the insulating layer 174 and metal layer, and other regions where elements of the LED package 160 are to be bonded.

Thereafter, the LED package 160 is disposed on the solder paste. Heat is the applied to the powder type solder paste, to melt the solder paste. As the solder paste is then solidified, the LED package 160 is fixed in place. Through the process of melting and solidifying the solder paste, the bonding layer 178 is formed. In accordance with the formation of the bonding layer 178, the LED package 160 is completely fixed to the upper surface of the PCB 150.

The procedure of forming the through hole 177 through the insulating layer 174 and metal layer and the procedure of forming the circuit layer 176 by patterning the metal layer may be reversed. That is, in a state in which the insulating layer 174 and metal layer are laminated over the base 172, the metal layer may be patterned to form the circuit layer 176, and then the through hole 177 may be formed through the insulating layer 174 and metal layer.

Also, the procedure of laminating the insulating layer 174 and metal layer over the base 172 and the procedure of forming the through hole 177 through the insulating layer 174 and metal layer may be reversed. As shown in FIGS. 5A to 5D, in a state in which the insulating layer 174 and metal layer are coupled, the through hole 177 may be formed at a position where the LED package 160 is to be mounted, and then the insulating layer 174 and metal layer formed with the through hole 177 may be laminated over the base 172. The subsequent procedures may be identical to those of the previously-described LED module manufacturing method.

In accordance with exemplary embodiments described herein, it may be possible to effectively dissipate heat generated from LED chips, and thus to increase the life span of the LED chips.

Although exemplary embodiments have been shown and described, it would be appreciated by those skilled in the art that changes may be made in these embodiments without departing from the principles and spirit of the inventive concept, the scope of which is defined in the claims and their equivalents.

What is claimed is:
1. A light emitting diode (LED) module comprising:
   a base made of a metal material;
   an insulating layer provided on the base;
   a circuit layer provided on the insulating layer;
   an LED package provided on the circuit layer, the LED package comprising an LED chip and a heat dissipation member coupled to a lower surface of the LED chip; and
   a bonding layer which extends through the insulating layer and the circuit layer, is bonded to the heat dissipation member and connects the LED package to the base.
2. The LED module according to claim 1, wherein the bonding layer comprises a paste made of a metal material.
3. The LED module according to claim 1, wherein the heat dissipation member is made of a metal material, and comprises a heat slug.
4. The LED module according to claim 3, wherein the LED package comprises:
   a positive electrode and a negative electrode which supply power to the LED chip; and
   a wire which connects the positive electrode to the LED chip and a wire which connects the negative electrode to the LED chip.
5. The LED module according to claim 4, wherein the heat dissipation member is electrically isolated from the positive electrode and the negative electrode.
6. The LED module according to claim 5, further comprising a conductive adhesive which couples the LED chip to the heat dissipation member.
7. The LED module according to claim 1, further comprising a heat sink coupled to a surface of the base.
8. A light emitting diode (LED) module comprising:
   a base made of a metal material;
   a circuit layer provided on the base;
   an insulating layer provided between the base and the circuit layer;
   an LED package provided on the circuit layer, the LED package comprising an LED chip and a heat dissipation member coupled to a lower surface of the LED chip; and
   a bonding layer provided within a through hole, wherein the through hole extends through the insulating layer and the circuit layer, and the bonding layer is bonded to the heat dissipation member and fixes the LED package to the base.
9. The LED module according to claim 8, wherein the LED chip is disposed in a position corresponding to a position of the through hole.
10. A light emitting diode (LED) module comprising:
   a printed circuit board comprising a base, a circuit layer, and an insulating layer, disposed between the base and the circuit layer, wherein a through hole is formed through the circuit layer and the insulating layer such that the base is exposed through the through hole;
   an LED package disposed on the printed circuit board, wherein the LED package comprises:
      a heat dissipation member affixed to the base via a bonding layer disposed within the through hole;
      an LED chip affixed to the heat dissipation member;
   wherein the bonding layer comprises a metal material.

* * * * *